United States Patent
Ouyang et al.

(10) Patent No.: US 6,864,670 B2
(45) Date of Patent: Mar. 8, 2005

(54) METHOD FOR ELIMINATING NOISE INTERFERENCE AND ACOUSTIC NOISE BY PRINTED CIRCUIT BOARD GROUND PLANE LAYOUT

(75) Inventors: Jr-Hong Ouyang, Taipei (TW); Hui-Chuan Lai, Taipei (TW); Jing-Cheng Lin, Taipei (TW)

(73) Assignee: Delta Electronics, Inc., Taipei (TW)

( * ) Notice: Subject to any disclaimer, the term of this patent is extended or adjusted under 35 U.S.C. 154(b) by 73 days.

(21) Appl. No.: 10/442,118

(22) Filed: May 21, 2003

(65) Prior Publication Data

US 2004/0100233 A1 May 27, 2004

(30) Foreign Application Priority Data

Nov. 25, 2002 (TW) ........................................ 91134221 A

(51) Int. Cl.[7] ................................................ G05F 1/59
(52) U.S. Cl. .......................................... 323/271; 363/39
(58) Field of Search ................................. 323/267, 271, 323/272; 363/39

(56) References Cited

U.S. PATENT DOCUMENTS

| | | | | |
|---|---|---|---|---|
| 4,034,232 A | * | 7/1977 | LaVenture | ................... 307/32 |
| 5,886,508 A | * | 3/1999 | Jutras | .......................... 323/267 |
| 5,969,512 A | * | 10/1999 | Matsuyama | .................. 323/272 |
| 6,674,270 B2 | * | 1/2004 | Sakamoto | .................... 323/272 |
| 6,771,052 B2 | * | 8/2004 | Ostojic | ........................ 323/266 |

* cited by examiner

Primary Examiner—Jeffrey Sterrett
(74) Attorney, Agent, or Firm—Bacon & Thomas PLLC

(57) ABSTRACT

A method for eliminating noise interference and acoustic noise by a printed circuit board ground plane layout is disclosed. The method is applied to a circuit system having multiple outputs, wherein the circuit system has a first power converting module, a second power converting module and a printed circuit board. The first power converting module and the second power converting module respectively includes a first ground pin group and a second ground pin group. The method includes the steps of (a) connecting each ground pin of the first ground pin group to a respective solder point and connecting each solder point to a first node, and connecting each ground pin of the second ground pin group to a respective solder point and connecting each solder point to a second node, and (b) connecting the first node and the second node to a common node and connecting the common node to a solder point of a common ground terminal on the printed circuit board ground plane.

14 Claims, 4 Drawing Sheets

METHOD FOR ELIMINATING NOISE INTERFERENCE AND ACOUSTIC NOISE BY PRINTED CIRCUIT BOARD GROUND PLANE LAYOUT

FIELD OF THE INVENTION

This invention relates to a method for eliminating noise interference and acoustic noise by a printed circuit board ground plane layout, and more particular to a method for eliminating noise interference and acoustic noise by a printed circuit board ground plane layout used in a power supply system having multiple outputs.

BACKGROUND OF THE INVENTION

Because of the progress of technologies, various electronic products have been shown up in the marketplace. It is widely known that the core of an electronic products is a printed circuit board. The normal operation of the electronic element mounted on a printed circuit board is a key factor for allowing an electronic product to function normally. However, signals of different frequencies are present in electronic circuits and systems. When there exists a frequency difference between signals, a mutual interference between electronic circuits and systems will be produced and cause the electronic product unstable or produce an acoustic noise. For some electronic products or video games requiring a high stability, it is not allowable to have an unstable function, noise interference and acoustic noise.

Taking a Play Station II (PS2) which is popular nowadays as an example, the power supply system thereof generally includes a power converting module operating at multiple operation frequencies for providing a predetermined level of output voltage to a joystick of an electronic entertainment machine or a central processing unit of an externally-connected device etc. The conventional power supply system having multiple outputs will implement each power supply as an independent power converting module. However, in order to comply with a trend of miniaturization of an electronic product, it is not quite cost effective if multiple power supplies are respectively implemented as an independent power module. Thus a current method for solving this situation is to put all the individual power converting modules together.

However, even all the individual power converting modules are combined together, a thorny problem is still inevitable. That is, when each power converting module having different operation frequency is combined together, they will interfere with each other and become unstable. Generally, the ground plane of the printed circuit board utilizes a piece of copper foil in its entirety to connect the ground pins of the electronic elements in each power converting module, and thus a complete ground plane loop will be formed and noise interference is produced accordingly. Therefore, in order to solve this problem, a method of frequency synchronization has been put into practiced presently. The so-called frequency synchronization is to conform the operation frequencies of multiple outputs to each other. Such frequency synchronization method has two advantages. The first one is that the operation frequency of the multiple outputs will not be different with each other once the frequency synchronization is accomplished. Because a power converting module operating at a different frequency will interfere the output of other power converting module, no matter how many power converting modules will be, operation frequency difference will not be produced after synchronization, so that the outputs of other power converting modules will not interfere with each other, and the stability of other power converting modules will not be influenced. The second one is that because the operation frequency has been synchronized and the frequency difference is obviated, acoustic noise will not be produced. Generally, the "buzz" sound produced by the machine is exactly ascribed to this situation. Thus, the method for solving the acoustic noise is to synchronize the operation frequency.

However, if the operation frequency of each power converting module is synchronized, all the operation frequencies will be forced to accommodate to the highest one. However, some power converting modules do not need to have such a high frequency in use. Furthermore, the higher the frequency, the greater the noise interference, and the higher cost of the electronic element will be. Thus, the synchronization of operation frequency will not only cause the application to lose its flexibility but result in a cost waste.

To sum up, no matter the operation frequency of each power converting module is synchronous or asynchronous, three problems will be brought about:

1. If the operation frequencies of multiple outputs are different, the power converting modules will interfere with each other and become unstable.
2. If the operation frequencies of multiple outputs are asynchronous, the power converting module will produce acoustic noise owing to the frequency difference.
3. If the operation frequencies of multiple outputs are synchronous, the operation frequency of all power converting modules will be forced to accommodate to the highest one. Also, under this condition, the application thereof will be inflexible, but and the cost will become higher when the frequency is higher, leading to a cost waste.

Consequently, how to solve the problems described above is the main purpose of the present invention.

SUMMARY OF THE INVENTION

It is an object of the present invention to provide a tree branching technique by a printed circuit board ground plane layout for avoiding a noise loop and further eliminating noise interference and acoustic noise.

It is another object of the present invention to provide a power supply system having multiple outputs which can achieve the purposes of system stabilization and noise interference and acoustic noise reduction without the need of synchronizing the operation frequencies of multiple power converting modules.

It is a further object of the present invention to provide a method for eliminating noise interference and acoustic noise by a printed circuit board ground plane layout, which can be applied for a power supply system having multiple outputs for adjusting the operation frequency of each power converting module so as to reduce cost and increase efficiency.

In accordance with an aspect of the present invention, a method for eliminating noise interference and acoustic noise by a printed circuit board ground plane layout applicable to a circuit system having multiple outputs, wherein the circuit system has a first power converting module, a second power converting module and a printed circuit board, and the first power converting module and the second power converting module respectively includes a first ground pin group and a second ground pin group, the method includes steps of (a) connecting each ground pin of the first ground pin group of the first power converting module to a respective solder point on the printed circuit board ground plane and connecting each solder point to a first node on the printed circuit board ground plane, and connecting each ground pin of the second ground pin group of the second power converting module to a respective solder point on the printed circuit board ground plane and connecting each solder point to a second node on the printed circuit board ground plane, and (b) connecting the first node and the second node to a common node and connecting the common node to a solder point of a common ground terminal on the printed circuit board ground plane.

In accordance with another aspect of the present invention, a power supply system having multiple outputs includes a printed circuit board having a ground plane, a first power converting module and a second power converting module respectively having multiple electronic elements for respectively converting an input voltage into a first and a second voltage outputs of a predetermined voltage level, wherein the multiple electronic elements of the first power converting module include a first ground pin group and the multiple electronic elements of the second power converting module include a second ground pin group, each ground pin of the first ground pin group is connected to a respective solder point on the ground plane of the printed circuit board and each solder point is connected to a first node, and each group pin of the second ground pin group is connected to a respective solder point on the ground plane of the printed circuit board and each solder point is connected to a second node, and the first node and the second node are connected to a common node and the common node is connected to a solder point of a common ground terminal.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Because the effect of the noise interference must be achieved by relying on a complete loop, the present invention utilizes a tree branching technology applicable to a printed circuit board ground plane layout to avoid a noise loop, and therefore the problem of noise interference can be solved. Furthermore, the synchronization of the operation frequency of each power converting module is unnecessary through the use of the present invention, and thus the operation frequencies of different power converting modules can be adjusted depending on actual requirement.

Figure 1:
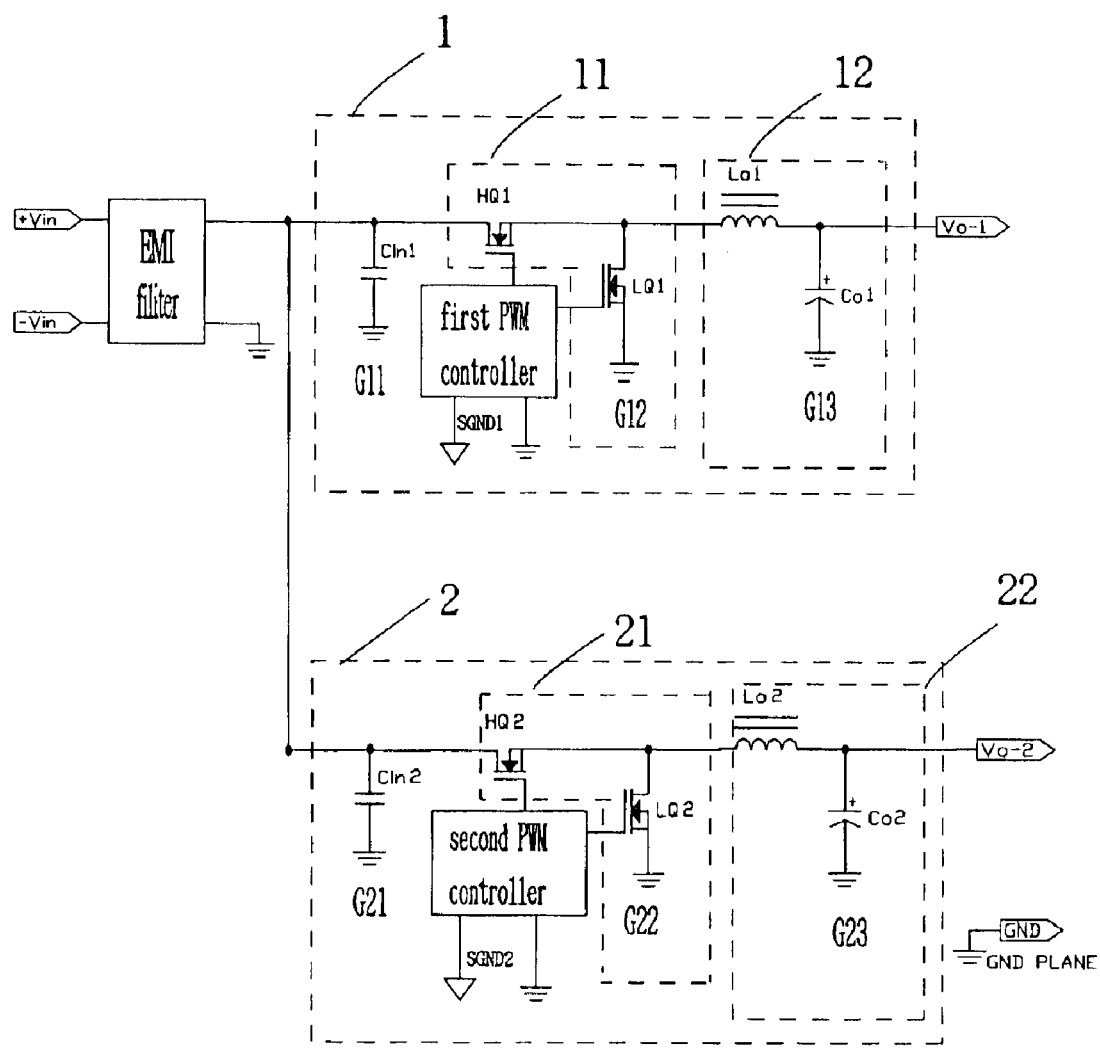
FIG. 1 shows a circuit block diagram of a power supply system with power converting modules operating at two different operation frequencies by utilizing the printed circuit board ground plane layout according to the present invention.

Please refer to FIG. 1 illustrating a circuit block diagram of a power supply system with power converting modules operating at two different operation frequencies by utilizing the printed circuit board ground plane layout according to the present invention. As shown in FIG. 1, the power supply system having multiple outputs according to the present invention includes a first power converting module 1 and a second power converting module 2 for respectively converting an input voltage into a first output voltage $V_{o1}$ and a second output voltage $V_{o2}$, wherein the first power converting module 1 and the second power converting module 2 are respectively comprised of a switch circuit 11, 21, a filter circuit 12, 22, a first pulse width modulation (PWM) controller and a second pulse width modulation (PWM) controller for the purpose of voltage conversion and output voltage at a specific level.

Please refer to FIG. 1 again. As an input voltage $V_{in}$ is inputted into the power supply system, the first power converting module 1 and the second power converting module 2 are able to convert voltage by the operations of the switch circuit 11, 12, the first and the second PWM controllers, and then the converted voltage is filtered by the filter circuits 12, 22 and produce two output voltages $V_{o1}$ and $V_{o2}$ at a specific level. The operation frequency of the first power converting module 1 and the second power converting module 2 can be synchronous or asynchronous. Each output is connected to a power receiving device to meet with the specification required by each power receiving device.

In the first power converting modules 1 and the second power converting module 2, there respectively provides multiple electronic elements, such as transistors ($HQ_1$, $LQ_1$, $HQ_2$ and $LQ_2$), capacitors ($C_{in1}$, $C_{o1}$, $C_{in2}$ and $C_{o2}$) and inductances ($L_{o1}$ and $L_{o2}$) that forms the switching circuits 11, 12 and the filter circuits 12, 22 etc. The multiple electronic elements ($C_{in1}$, $LQ_1$, and $C_{o1}$) of the first power converting module 1 form a first ground pin group (G11, G12, and G13) and the multiple electronic elements ($C_{in2}$, $LQ_2$, and $C_{o2}$) of the second power converting module 2 from a second ground pin group (G21, G22, and G23).

Figure 2:
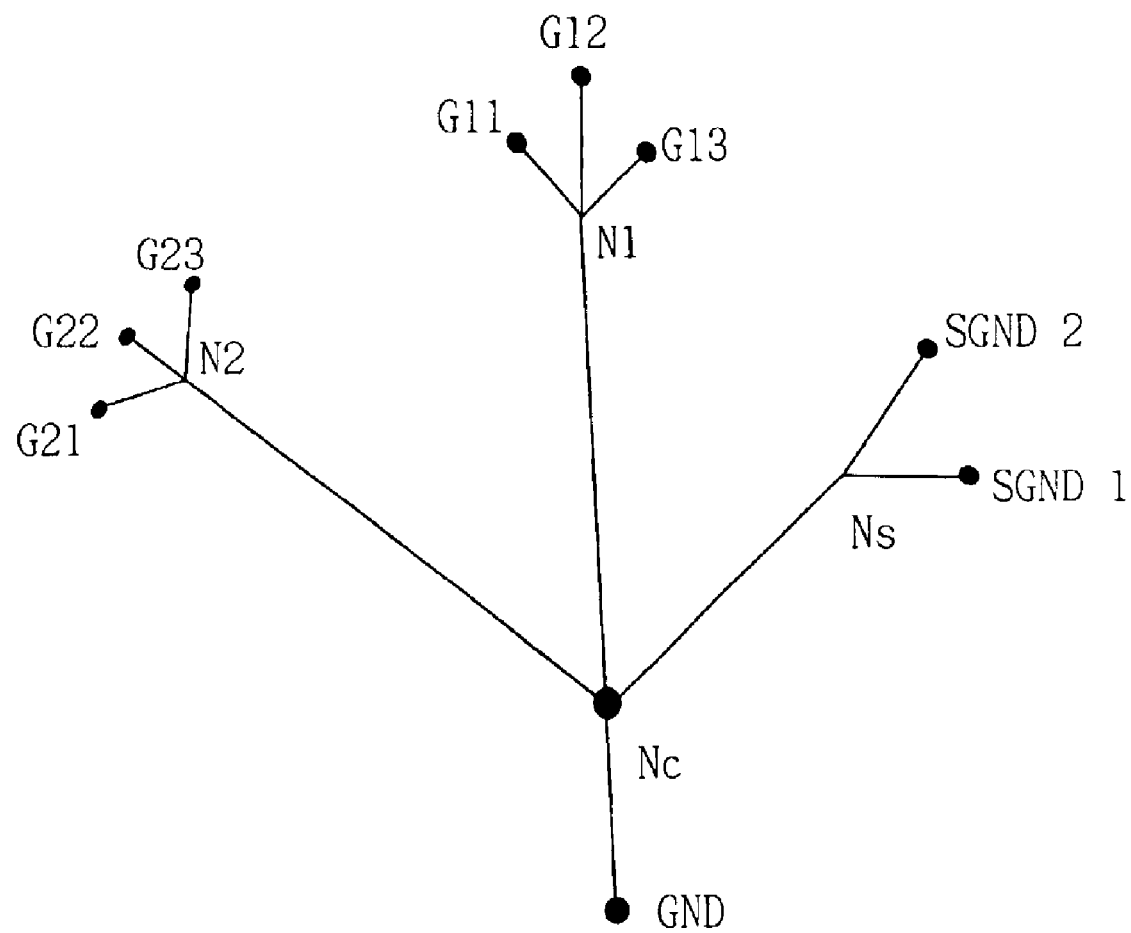
FIG. 2 shows a structural schematic view of a printed circuit board ground plane layout based on the circuitry of FIG. 1 according to a preferred embodiment of the present invention.

Please refer to FIG. 2 illustrating a structural schematic view of a printed circuit board ground plane layout based on the circuitry according to a preferred embodiment of the present invention. As shown in FIG. 2, the ground pins of the first ground pin group (G11, G12, and G13) of the first power converting module 1 are respectively connected to the solder points on the printed circuit board, and then each solder point is respectively connected to a first node N1 on the ground plane of the printed circuit board. Next, the ground pins of the second ground pin group (G21, G22, and G23) of the second power converting module 2 are also respectively connected to solder points on the printed circuit board, and then each solder point is respectively connected to a second node N2 on the ground plane of the printed circuit board. All the branches, namely the branches connected to the first node N1 and to the second node N2, are jointly connected to a trunk, namely connected to a common node $N_C$, and then connected to a solder point of a common ground terminal, so as to form a printed circuit board ground plane layout of a tree branch type.

If the ground plane of the printed circuit board is cut apart based on the method described above, the ground pins G11, G12, G13, G21, G22, G23, and GND of the main electronic elements will not form a loop, so that all the noise will not form a loop. Thus, wherever a noise is produced, it will not form a noise loop since a route that has been passed through by noise can not be passed through by noise again, so that noise can not return to the original node. Consequently, the problem of noise interference will not be generated.

Additionally, signal ground pins SGND1 and SGND2 of the first PWM controller and the second PWM controller can be cut apart by a similar manner as discussed above (as shown in FIGS. 1 and 2) or otherwise can be cut apart without adopting this method.

Figure 3:
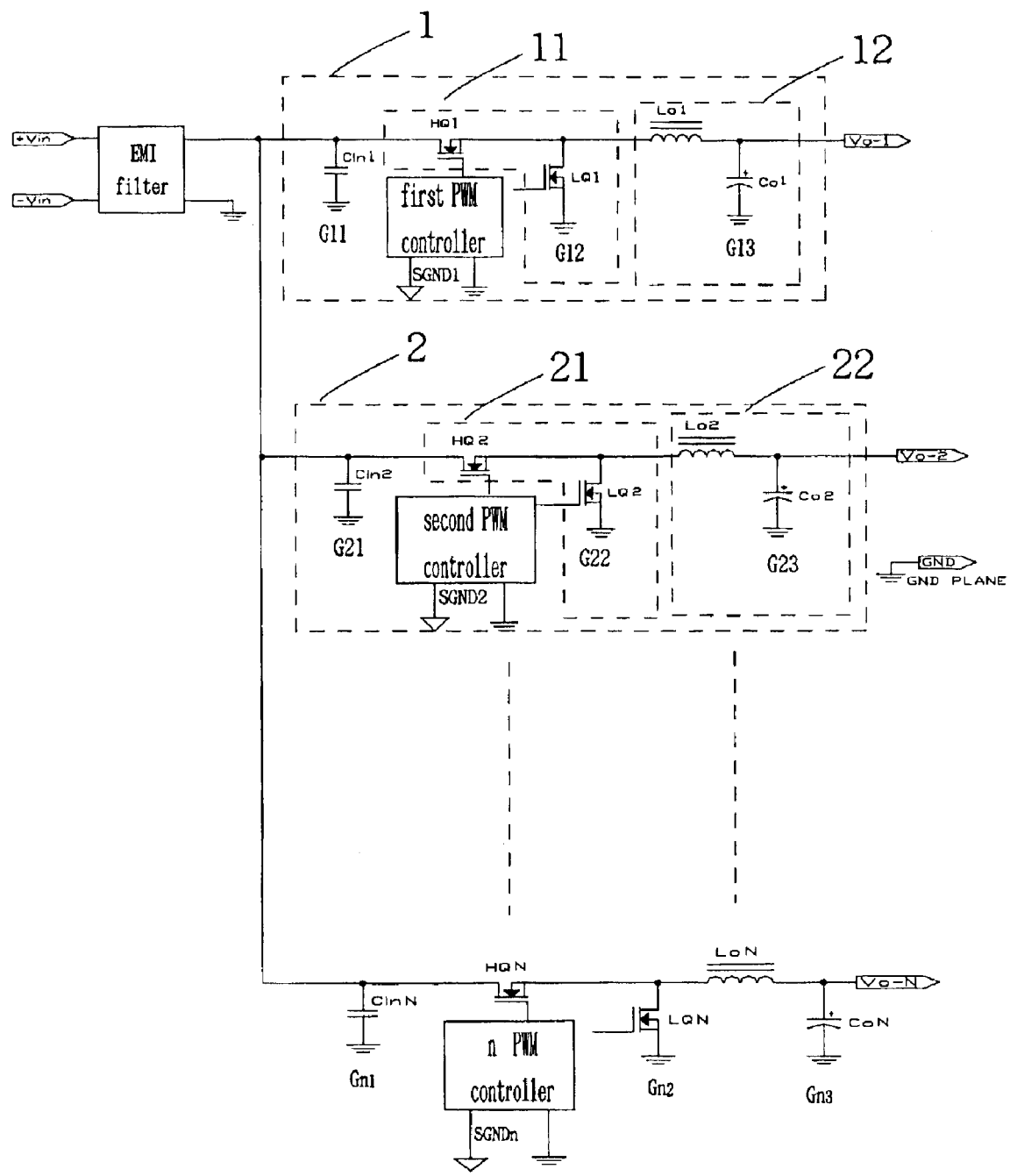
FIG. 3 shows a circuit block diagram of a power supply system with power converting modules operating at multiple different operation frequencies by utilizing the printed circuit board ground plane layout according to the present invention.
Figure 4:
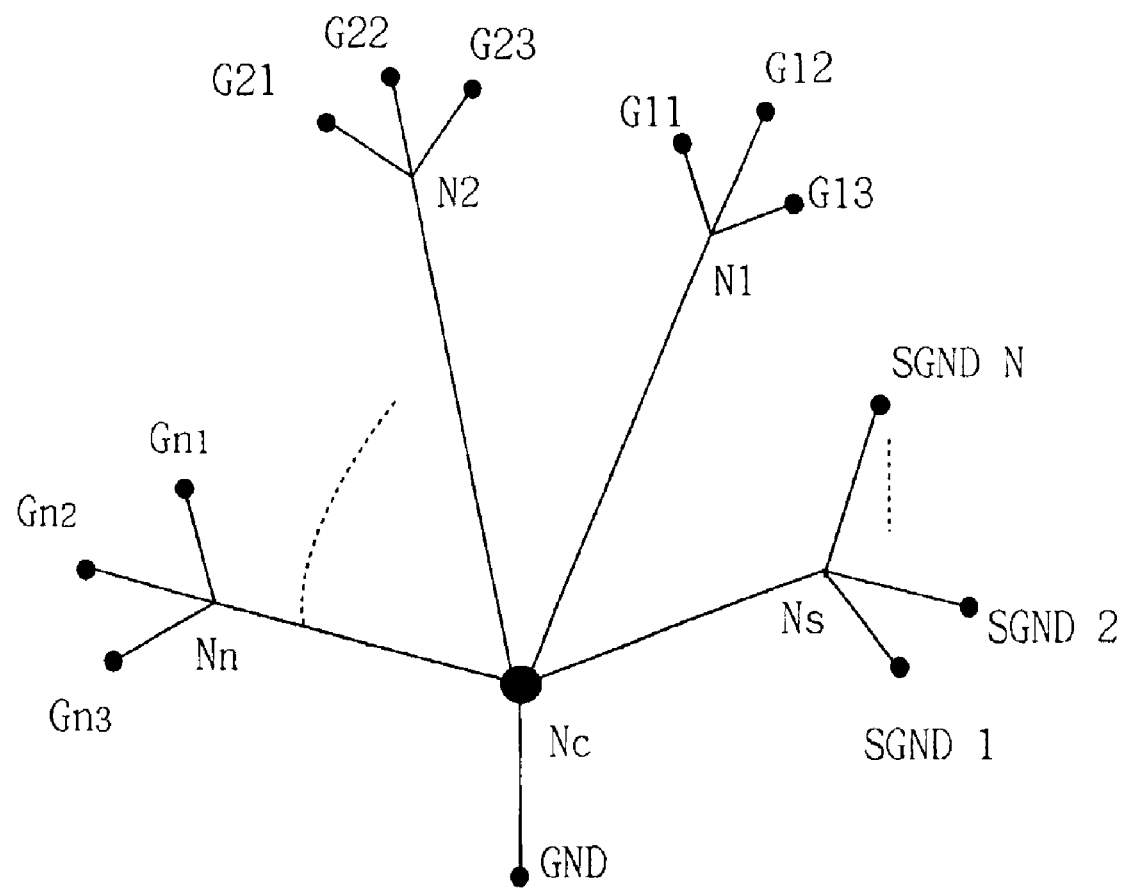
FIG. 4 shows a structural schematic view of a printed circuit board ground plane layout based on the circuitry of FIG. 3 according to another preferred embodiment of the present invention.

Please refer to FIG. 3 illustrating the circuit block diagram of a power supply system with power converting modules operating at N different operation frequencies by utilizing the printed circuit board ground plane layout according to the present invention, and also please refer to FIG. 4 illustrating a structural schematic view of a printed circuit board ground plane layout based on the circuitry of FIG. 3 according to another preferred embodiment of the present invention. As shown in FIGS. 3 and 4, although the power supply system having two outputs is taken as an example to explain the technique for eliminating noise interference and acoustic noise by the printed circuit board ground plane layout according to the embodiment described above, it is not limitative to a power supply system having two outputs. For one skilled in the art, the power supply system having N (e.g., N=3, 4 . . . ) outputs by using the printed circuit board ground plane layout according to the present invention is also possible. In addition, the implementation of tree branching technique is not limited to a single layer printed circuit board only, but can be effected in a multi-layer or double-sided printed circuit board. It is preferable that the power converting module is a DC/DC step-down converter.

In view of the foregoing, the present invention utilizes the tree branching technology in the printed circuit board ground plane layout for eliminating noise interference and acoustic noise, and further stabilizes the power supply system having multiple outputs, in particular the power supply system having multiple DC/DC converters. Thus, compared to the prior art, the present invention has the advantages as follows. Although the operation frequency of each power converting module according to the prior art is synchronized for eliminating the operation frequency difference and solving the problems of noise interference and acoustic noise, the operation frequency of all power converting modules must be forced to accommodate to the highest one under this condition. Unfortunately, some power converting modules do not need such a high operation frequency, and in addition, the higher the frequency, the greater the noise, and also the higher the cost of the electronic element. Therefore, synchronization of the operation frequencies of multiple outputs will cause the application thereof to be inflexible, and also result in a cost waste. However, the tree branching technology used in the printed circuit board ground plane layout according to the present invention can avoid the noise loop, eliminate the noise interference and the acoustic noise effectively, and further stabilize the circuit system having multiple outputs. Furthermore, because it is unnecessary to synchronize the operation frequencies of multiple outputs, the application of the present invention can be more flexible and the cost can be reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for eliminating noise interference and acoustic noise by a printed circuit board ground plane layout applicable to a circuit system having multiple outputs, wherein said circuit system has a first power converting module, a second power converting module, and a printed circuit board, and said first power converting module and said second power converting module respectively comprises a first ground pin group and a second ground pin group, comprising steps of:

(a) connecting each ground pin of said first ground pin group of said first power converting module to a respective solder point on said printed circuit board ground plane and connecting each solder point to a first node on said printed circuit board ground plane, and connecting each ground pin of said second ground pin group of said second power converting module to a respective solder point on said printed circuit board ground plane and connecting each solder point to a second node on said printed circuit board ground plane; and (b) connecting said first node and said second node to a common node and connecting said common node to a solder point of a common ground terminal on said printed circuit board ground plane.

2. A method according to claim 1 wherein said circuit system is a power supply system having multiple outputs.

3. A method according to claim 1 wherein said first power converting module and said second power converting module are DC/DC converters.

4. A method according to claim 1 wherein said first power converting module and said second power converting module are operated at a synchronous or an asynchronous operation frequency.

5. A method according to claim 1 wherein said first power converting module and said second power converting module of said circuit system respectively convert an input voltage into a first output voltage and a second output voltage.

6. A method according to claim 5 wherein said first power converting module and said second power converting module respectively comprises a switching circuit, a filter circuit, and a pulse width modulation (PWM) controller for generating an output voltage.

7. A method according to claim 6 wherein said first power converting module and said second power converting module respectively comprises multiple electronic elements to form said switching circuit and said filter circuit.

8. A method according to claim 7 wherein said multiple electronic elements comprise a transistor, a capacitor, and an inductance.

9. A method according to claim 8 wherein said multiple electronic elements of said first power converting module comprise said first ground pin group and said multiple electronic elements of said second power converting module comprise said second ground pin group.

10. A power supply system having multiple outputs, comprising:

a printed circuit board having a ground plane; and a first power converting module and a second power converting module respectively comprises multiple electronic elements for respectively converting an input voltage into a first and a second voltage outputs of a predetermined voltage level;

wherein said multiple electronic elements of said first power converting module comprises a first ground pin group and said multiple electronic elements of said second power converting module comprises a second ground pin group, each ground pin of said first ground pin group is connected to a respective solder point on said ground plane of said printed circuit board and each solder point is connected to a first node, and each group pin of said second ground pin group is connected to a respective solder point on said ground plane of said printed circuit board and each solder point is connected to a second node, and said first node and said second node are connected to a common node and said common node is connected to a solder point of a common ground terminal.

11. A power supply system according to claim 10 wherein said printed circuit board is a single layer printed circuit board or a multi-layer printed circuit board.

12. A power supply system according to claim 10 wherein both said first power converting module and said second power converting module are DC/DC converters.

13. A power supply system according to claim 10 wherein said first power converting module and said second power converting module operate at synchronous or asynchronous operation frequencies.

14. A power supply system according to claim 10 wherein said first power converting module and said second power converting module respectively comprises a switching circuit, a filter circuit and a pulse width modulation (PWM) controller for voltage conversion.

* * * * *